(12) United States Patent
Jung et al.

(10) Patent No.: US 7,494,844 B2
(45) Date of Patent: *Feb. 24, 2009

(54) METHOD FOR MANUFACTURING SUBSTRATE WITH CAVITY

(75) Inventors: Hoe-Ku Jung, Daejeon (KR);
Myung-Sam Kang, Daejeon (KR);
Jung-Hyun Park, Daejeon (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 237 days.

This patent is subject to a terminal disclaimer.

(21) Appl. No.: 11/524,402

(22) Filed: Sep. 21, 2006

(65) Prior Publication Data

US 2007/0065986 A1 Mar. 22, 2007

(30) Foreign Application Priority Data

Sep. 22, 2005 (KR) .................. 10-2005-0088093

(51) Int. Cl.
*H01L 21/44* (2006.01)

(52) U.S. Cl. .............. 438/108; 438/109; 438/117; 438/118; 438/613; 438/615; 257/E21.5; 257/E21.503; 257/E21.508; 257/E21.511; 257/E23.021; 257/E23.061; 257/E23.067; 257/E23.068

(58) Field of Classification Search ......... 438/106–118, 438/687, 613–618; 257/E21.5, E21.503, 257/508, 511, E23.021, 61, 67, 68
See application file for complete search history.

(56) References Cited

U.S. PATENT DOCUMENTS

| | | | | |
|---|---|---|---|---|
| 6,165,885 | A | * 12/2000 | Gaynes et al. | 438/612 |
| 2002/0155661 | A1 | * 10/2002 | Massingill et al. | 438/244 |
| 2004/0178492 | A1 | * 9/2004 | Tsukamoto et al. | 257/690 |
| 2007/0065986 | A1 | * 3/2007 | Jung et al. | 438/109 |
| 2007/0065988 | A1 | * 3/2007 | Jung et al. | 438/118 |

* cited by examiner

*Primary Examiner*—Michael S Lebentritt

(57) ABSTRACT

A method for manufacturing a substrate having a cavity is disclosed. The method comprises: (a) forming a first circuit pattern on one side of a seed layer by use of a first dry film; (b) laminating a second dry film on the first dry film, the thickness of the second dry film corresponding to the depth of the cavity to be formed; (c) laminating a dielectric layer on an area outside of where the cavity is to be formed, the thickness of the dielectric layer corresponding to the depth of the cavity to be formed; (d) laminating on the seed layer a copper foil laminated master having a second circuit pattern; and (e) forming the cavity by peeling off the first dry film and the second dry film after removing the seed layer. The method in accordance with the present invention can mount a plurality of integrated circuits by reducing the thickness of a substrate on a package on package.

7 Claims, 5 Drawing Sheets

METHOD FOR MANUFACTURING SUBSTRATE WITH CAVITY

BACKGROUND OF THE INVENTION

1. Field of the Invention

The present invention relates to a stacked-type semiconductor package module, more specifically to a method for manufacturing a substrate, on which a cavity is formed.

2. Description of the Related Art

With the development of the electronics industry, there has been increasing demands for electronic parts that perform better and are smaller. To accommodate these demands, the semiconductor packing technologies have been evolving from packing one integrated circuit on one substrate to packing several integrated circuits on one substrate. Moreover, to address the need for realizing high-performance, high-density packages, and to meet the demand for these packages, the "package on package (POP)" technology has been introduced. However, minimizing the thickness of the package has been a challenge to overcome for successful implementation of the POP technology.

FIG. 1 is a sectional view of a package on package in accordance with the prior art. FIG. 1 shows a lower package 110, an upper package 120, an upper solder ball 103, and a lower solder ball 140.

The conventional ball grid array (BGA) semiconductor package has a substrate body, in which a plurality of patterned conductive wires are installed. On top of the substrate body are a plurality of chip pads, to which semiconductor chips are wire-bonded. In addition, some area of the top of the substrate body is molded with an epoxy compound and forms a molding part, such that the semiconductor chip and metal wire are enveloped. Adhered to the bottom of the substrate are a plurality of solder balls such that the other ends of the conductive wires installed in the substrate can be connected. This structure of a conventional ball grip array semiconductor package is too thick to be stacked as a highly integrated memory module within a limited area.

The lower package 110 of the conventional package on package has a dual-level structure, and an integrated circuit is mounted on the surface of this substrate. The substrate of the lower package 110 is manufactured in the same method as manufacturing a general printed circuit board. The increasing density in the semiconductor package module necessitates the mounting of a plurality of integrated circuits. With the conventional method, it is difficult to increase the mounting in the lower package 110 while maintaining the overall height of the package on package. The die-thinning method, which reduces the thickness of a semiconductor chip, can be one way of reducing the height, but this raises the issue of function-error with a prolonged operation. Therefore, improvement in mounting capacity of the package on package is attempted by reducing the thickness of the substrate.

Since there are limitations to how thin the substrate can be made, the number of integrated circuits that can be mounted in the lower semiconductor package is also limited. Besides, embedding a semiconductor package in the substrate requires a drilling process, which is complicated and costly.

SUMMARY OF CERTAIN INVENTIVE ASPECTS

The present invention features a method for manufacturing a substrate with a cavity that manufactures a package on package substrate, on which a plurality of integrated circuits can be mounted by reducing the thickness of the substrate.

The present invention also provides a method for manufacturing a substrate with a cavity that can reduce the overall thickness of the semiconductor package by mounting the integrated circuits in the cavity.

The present invention also provides a method for manufacturing a substrate with a cavity that can simplify the process by mounting the integrated circuits in the cavity formed on the substrate, without using a separate drilling process.

Moreover, the present invention provides a method for manufacturing a substrate with a cavity that can make the package relatively thinner than other packages, on which the same number of integrated circuits are mounted, by incorporating the integrated circuits in the cavity formed on the substrate.

Furthermore, the present invention provides a method for manufacturing a substrate with a cavity that has a better finishing process than the conventional cavity-forming process by forming the cavity without using a separate drilling process.

The present invention also provides a method for manufacturing a substrate with a cavity that can mount multiple tiers of a plurality of integrated circuits in a lower package of a package on package.

Moreover, the present invention provides a method for manufacturing a substrate with a cavity that can reduce the thickness of a package on package substrate having at least 3 layers.

In addition, the present invention provides a method for manufacturing a substrate with a cavity that can reduce the manufacturing cost by eliminating the need for an additional cavity-forming process.

The present invention also provides a method for manufacturing a substrate with a cavity that can form a microcircuit by plating a pattern using a modified semi-additive process (MSAP).

An aspect of the present invention features a method for manufacturing a substrate having a cavity. The method can comprise: (a) forming a first circuit pattern on one side of a seed layer by use of a first dry film; (b) laminating a second dry film on the first dry film, the thickness of the second dry film corresponding to the depth of the cavity to be formed; (c) laminating a dielectric layer on an area outside of where the cavity is to be formed, the thickness of the dielectric layer corresponding to the depth of the cavity to be formed; (d) laminating on the seed layer a copper foil laminated master having a second circuit pattern; and (e) forming the cavity by peeling off the first dry film and the second dry film after removing the seed layer.

The method can further comprise the step of laminating in the formed cavity a bonding pad for electrically connecting an element and the substrate, by use of electrolytic plating or electroless plating.

The seed layer can be aluminum or nickel.

The step (a) can further comprise (f) forming the first circuit pattern by use of a modified semi-additive process (MSAP).

The step (b) can further comprise exposing and developing a dry film on an area excluding where the second dry film is laminated.

In the step (c), the dielectric layer can be a prepreg.

The method can further comprise (g) forming a via hole for electrically connecting the first circuit pattern and the second circuit pattern.

BRIEF DESCRIPTION OF THE DRAWINGS

These and other features, aspects, and advantages of the present invention will become better understood with regard to the following description, appended claims, and accompanying drawings where:

DETAILED DESCRIPTION OF CERTAIN INVENTIVE EMBODIMENTS

Figure 1:
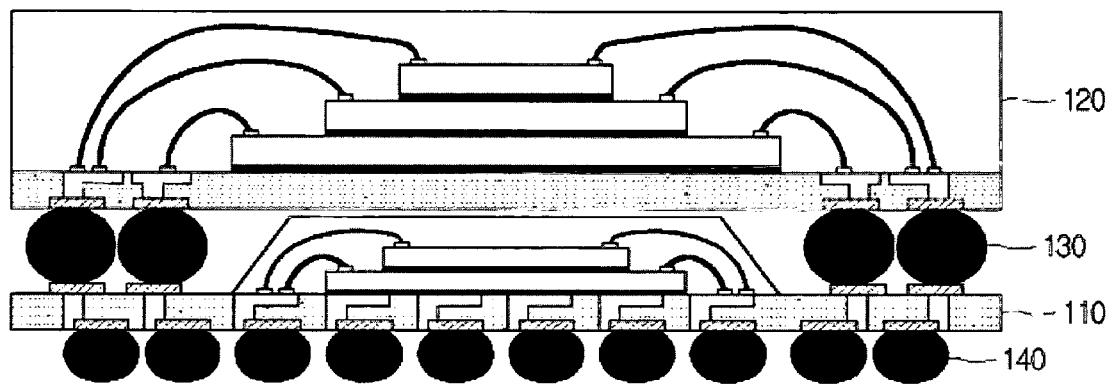
FIG. 1 shows a sectional view of a package on package in accordance with the prior art.

Hereinafter, a preferred embodiment of the method for manufacturing a substrate with a cavity will be described in detail with reference to the accompanying drawings. In referencing the accompanying drawings, identical elements are given the same reference numerals, regardless of their figure numbers, and any redundant description thereof will be omitted. In addition, prior to describing preferred embodiments of the present invention, the method for manufacturing a general substrate will be described first. Although the method for manufacturing a multi-layer substrate is described, the present invention is by no means restricted to the method for manufacturing a multi-layer substrate.

First, an internal circuit pattern is formed on the outside of a core layer. An inner-layer base material that meets the product specification is cut, and a predetermined internal circuit pattern is formed using a dry film and a working film. Here, the inner layer can be scrubbed, and an inner layer dry film can be laminated, and the inner layer can be exposed/developed.

Then, prior to bonding the inner layer, on which the circuit pattern is formed, to the outer layer, a brown (black) oxide process is carried out in order to strengthen the adhesion. That is, the surface of a copper foil is chemically oxidized to enhance the surface roughness such that the lamination results in better adhesion. Then, by laminating the inner-layer substrate and a prepreg, prelamination and lamination processes are carried out.

Then, the laminated inner layer substrate and the prepreg are vacuum pressed. It is possible that the laminated inner layer substrate and the prepreg are hot pressed or cool pressed, instead of being vacuum pressed.

The resin and copper foil are trimmed from the corners of the panel, and an X-ray target drilling process, in which a hole is made at a target guide mark on the inner layer circuit, is carried out in preparation of a drilling process.

Then, the drilling process is carried out for electric conduction between the layers of the substrate. Here, a computer numerical control (CNC) method can be used for the drilling process.

Then, the outer layer is coated with the dry film and the working film in order to form a circuit pattern, exposed to a light of a predetermined intensity for a predetermined duration, and the unirradiated areas are developed in an etching process. After examining the outer layer and measuring the scale, a solder resist exposure film is designed and manufactured. Then, a preprocess, such as brush polishing, in which the surface of copper foil is made rough such that the solder resist ink is better adhered to the substrate, is carried out. The solder resist is then coated; the solder resist is exposed using the solder resist exposure film, designed adaptively in the preceding process; the solder resist is removed in a development process; and a variety of postprocesses, including electric/final tests, are carried out.

Figure 2:
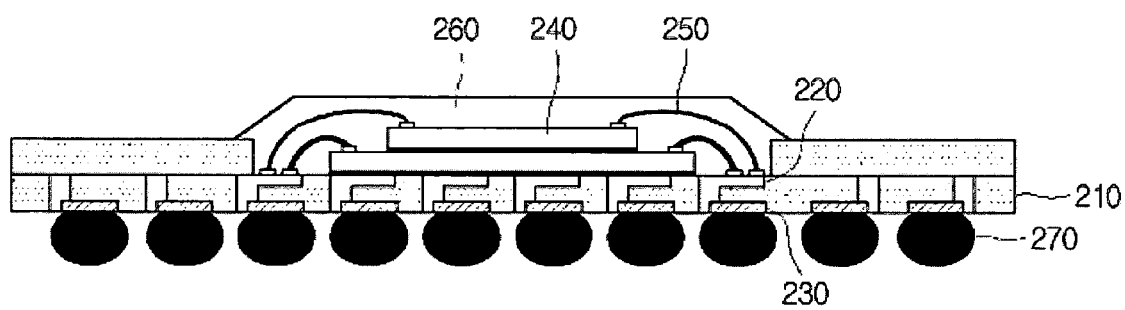
FIG. 2 shows a general illustration of a sectional view of a package on package in accordance with a preferred embodiment of the present invention.

FIG. 2 is a general illustration of the cut section of a semiconductor package, constituting a package on package, in accordance with a preferred embodiment of the present invention. Referring to FIG. 2, the semiconductor package in accordance with the present invention comprises a core layer 210, a conductive circuit 220, a metal pad 230, an integrated circuit 240, a metal wire 250, a molding part 260, and a solder ball 270.

According to the present invention, at least one integrated circuit 240 is seated and located in a cavity, which is formed on a substrate, in order to reduce the thickness of the semiconductor package. That is, the cavity is formed in the upper part of the core layer 210 of a package on package, using a dielectric layer, and the integrated circuit 240 is inserted in the formed cavity. Then, the integrated circuit 240 is electrically coupled to the conductive circuit 220 and the metal pad 230, using the metal wire 250. Using a protective material, such as epoxy resin, the molding part is formed around and on top of the integrated circuit 240.

Figure 3:
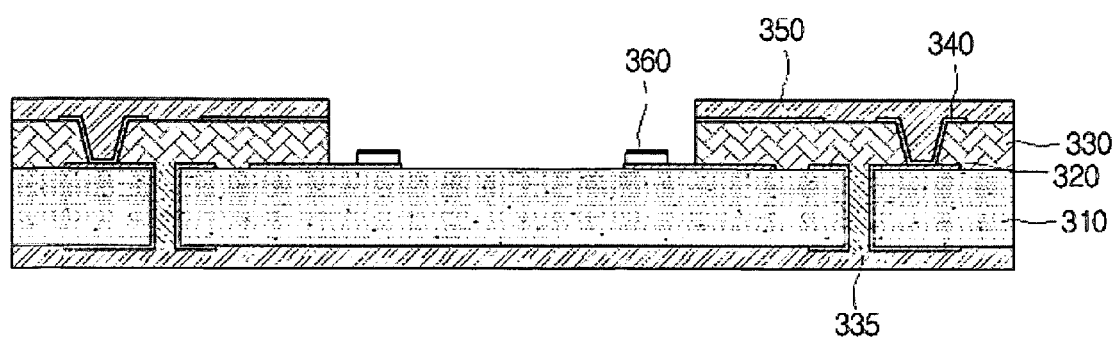
FIG. 3 shows a sectional view of a package on package in accordance with a preferred embodiment of the present invention.

FIG. 3 is a sectional view of a package on package in accordance with a preferred embodiment of the present invention. Referring to FIG. 3, the substrate in accordance with the present invention can comprise a core layer 310, an internal circuit 320, a dielectric layer 330, an interstitial via hole (IVH) 335, an external circuit 340, a solder resist 350, and a bonding pad 360.

The core layer 310 can be a copper foil laminated master, on which the internal circuit 320 is formed, and the dielectric layer 330 can be made of a dielectric material, such as a prepreg or a resin coated copper foil (RCC).

The internal circuit 320 and the external circuit 340 can be electrically connected to each other by the IVH 335 and a blind via hole (BVH). Here, the internal circuit 320 and the external circuit 340 can also be electrically connected to each other by a plated through hole (PTH, not shown).

The bonding pad 360 is seated in the cavity and connects a semiconductor chip and the substrate. The semiconductor chip and the substrate can be coupled to each other through flip-chip bonding or wire bonding.

FIGS. 4-9 illustrate the method for manufacturing the substrate, on which the cavity is formed, used for a package on package in accordance with a preferred embodiment of the present invention.

Figure 4:
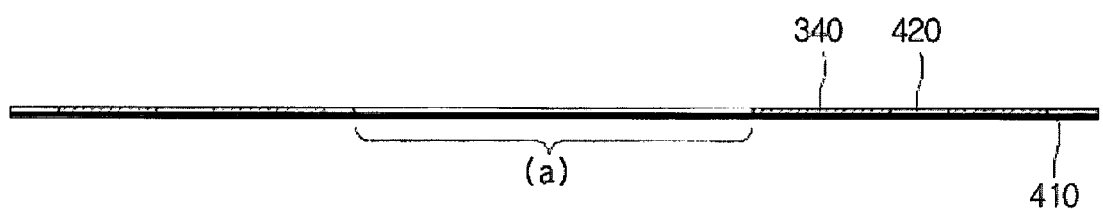
FIGS. 4-9 illustrate the method for manufacturing a substrate, on which a cavity is formed, used for a package on package in accordance with a preferred embodiment of the present invention.

Referring to FIG. 4, a dry film (or a first dry film) 420 is coated on a seed layer 410 in order to form a circuit on a dielectric layer, and a certain circuit pattern (or a first circuit pattern) 340 is formed. The seed layer 410 can be aluminum or nickel. The area (a), in which the cavity is to be formed, is predetermined. After the circuit pattern is formed, a pattern is plated through a semi-additive process (SAP) or a modified semi-additive process (MSAP).

The semi-additive process forms a circuit pattern after forming a copper (Cu) seed layer through electroless plating, using a material that does not have a seed layer. That is, a plating resist is used on the surface of a copper foil, which is on the outer layer of a copper-clad laminate, and the plating resist in the area where the circuit is to be formed is peeled off through exposure and developing processes. As a result, the surface of the outer copper foil becomes exposed, and the plating resist of only the area where the circuit is not to be formed remains on the outer layer of the copper foil. By copper-plating on the surface, the plating resist is peeled off to form a copper plated circuit layer on the surface of the exposed outer copper foil, thereby forming a circuit pattern. Once the plating is completed, the remaining plating resist is peeled off, and the copper foil between the wiring in the formed circuits is dissolved off using flush etching, thereby completing the printed circuit board. When the copper foil layer is removed through flush etching, the upper edge of the copper plated circuit layer becomes also eroded, deteriorating the shape of the final printed circuit board as well as the aspect ratio of the cross-section of the circuit. To avoid this, the following process can be also carried out: In the semi-additive method, the copper plated circuit layer and outer layer copper foil layer must have the Rv value, which is Vsc/Vsp, of 1.0 or higher, whereas Vsp is the dissolving speed of the extracted copper constituting the copper plated circuit layer, and Vsc is the dissolving speed of the copper constituting the outer layer copper foil layer. The modified semi-additive process forms a circuit pattern using a material on which copper is laminated from the beginning, that is, a material having a seed layer. The rest of the process is identical to the above semi-additive process. For the seed layer of the present invention, nickel or aluminum can be used. Thus, since the materials for the seed layer and the circuit are different from each other, the seed layer can be selectively etched.

Figure 5:
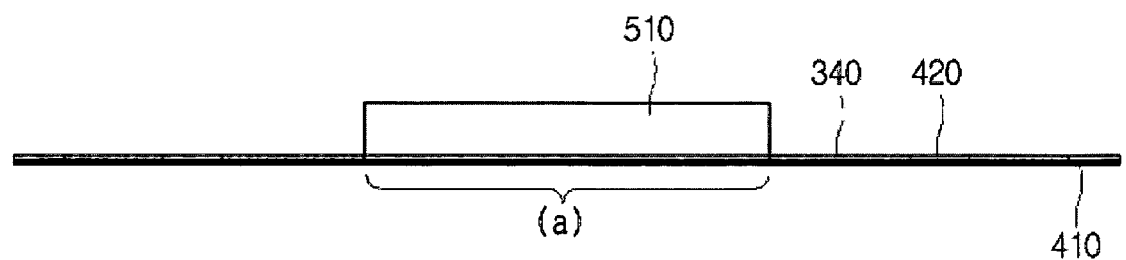

Referring to FIG. 5, a dry film (or a second dry film) 510, which is thicker (the thickness corresponding to the height of the cavity to be formed) than the dry film used for pattern plating, is laminated after the pattern plating, and then the area outside (a), where the cavity is to be formed, is developed.

Figure 6:
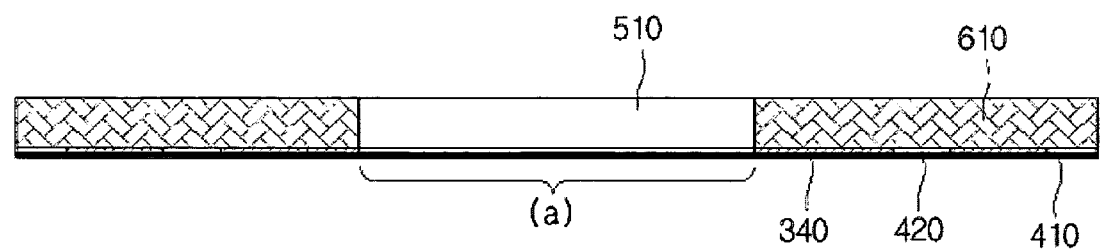

Referring to FIG. 6, to form a dielectric layers 610, a prepreg or bonding sheet is deposited and laid up in accordance with the height of the dry film 510 coated in the area where the cavity is to be formed. Here, a pre-process can be done in order to increase the adhesion between the plated pattern and the dielectric layer 610.

Figure 7:
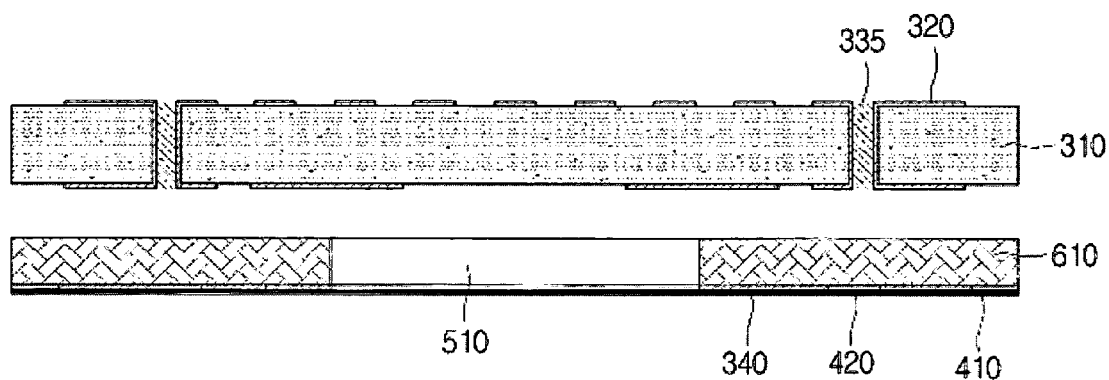

Referring to FIG. 7, a copper foil laminated master 310, on which a circuit pattern (or a second circuit pattern) 320 is formed, is deposited on the dielectric layer 610. Here, the copper foil laminated master 310 is deposited on the dielectric layer 610 and the first and second dry films 420 and 510. That is, the copper foil laminated master 310, on which the second circuit pattern 320 is formed, is deposited such that the first and second dry films 420 and 510 and the seed layer 410 are contained. In order to prevent the dielectric layer 610 from flowing out through the IVH 335, the copper foil laminated master 310, on which the second circuit pattern is formed, is laminated on the dielectric layer 610 after the IVH 335 is plugged.

Figure 8:
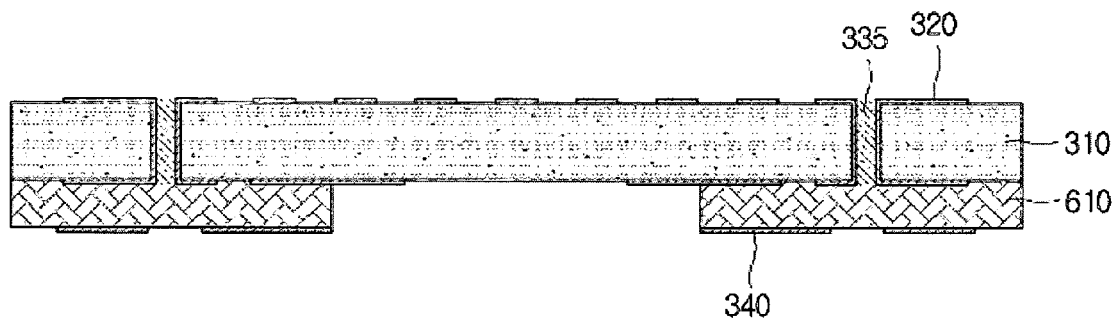

Referring to FIG. 8, after depositing the copper foil laminated master 310, on which the circuit pattern (or the second circuit pattern) 320 is formed, on the dielectric layer 610, the aluminum or nickel, which worked as the seed layer 410, is etched off using an etching solution, and the dry film is peeled off, thereby forming the cavity. The dry film can be peeled off using an NaOH solution.

Figure 9:
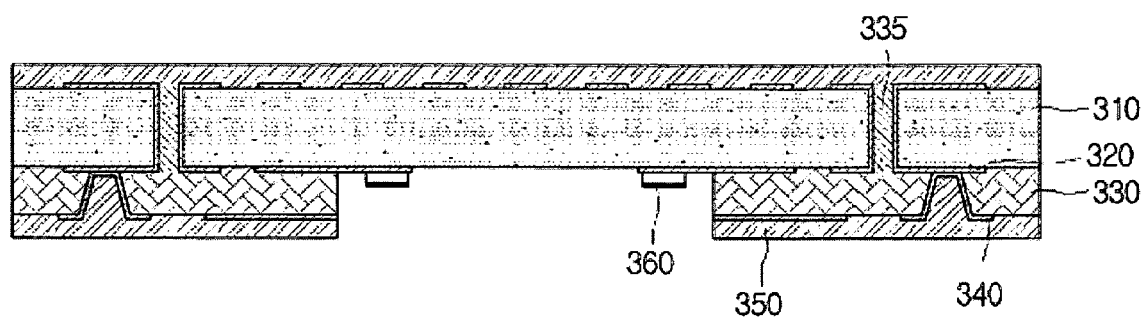

Referring to FIG. 9, a blind via hole (BVH) is formed using a laser drill in order to electrically connect the upper and lower layers (the first and second circuit patterns) after the lamination is completed. Then, plating is carried out for electrical conduction. A photoresist process can be introduced later for the protection of the circuit. By forming a bonding pad 360 through electroless plating or electrolytic plating, the manufacturing of the substrate is completed.

As described above, the method in accordance with the present invention for manufacturing a substrate with a cavity can manufacture a package on package substrate, on which a plurality of integrated circuits can be mounted by reducing the thickness of the substrate.

The method for manufacturing a substrate with a cavity can reduce the overall thickness of the semiconductor package by mounting the integrated circuits in the cavity.

The method for manufacturing a substrate with a cavity can simplify the process by mounting the integrated circuits in the cavity formed on the substrate, without using a separate drilling process.

Moreover, the method for manufacturing a substrate with a cavity can make the package relatively thinner than other packages, on which the same number of integrated circuits are mounted, by incorporating the integrated circuits in the cavity formed on the substrate.

Furthermore, the present invention provides a method for manufacturing a substrate with a cavity that has a better finishing process than the conventional cavity-forming process by forming the cavity without using a separate drilling process.

The present invention also provides a method for manufacturing a substrate with a cavity that can mount multiple tiers of a plurality of integrated circuits in a lower package of a package on package.

Moreover, the present invention provides a method for manufacturing a substrate with a cavity that can reduce the thickness of a package on package substrate having at least 3 layers.

In addition, the present invention provides a method for manufacturing a substrate with a cavity that can reduce the manufacturing cost by eliminating the need for an additional cavity-forming process.

Also, the method for manufacturing a substrate with a cavity in accordance with the present invention can form a microcircuit by plating a pattern using a modified semi-additive process (MSAP).

Although certain preferred embodiments of the present invention have been described, anyone of ordinary skill in the art to which the invention pertains should be able to understand that a large number of modifications and permutations are possible within the spirit and scope of the invention and its equivalents, which shall only be defined by the claims, appended below.

What is claimed is:

1. A method for manufacturing a substrate, the substrate having a cavity, the method comprising:
    forming a first circuit pattern on one side of a seed layer by use of a first dry film;
    laminating a second dry film on the first dry film, the thickness of the second dry film corresponding to the depth of the cavity to be formed;
    laminating a dielectric layer on an area outside of where the cavity is to be formed, the thickness of the dielectric layer corresponding to the depth of the cavity to be formed;
    laminating on the seed layer a copper foil laminated master having a second circuit pattern; and
    forming the cavity by peeling off the first dry film and the second dry film after removing the seed layer.

2. The method of claim 1, further comprising laminating in the formed cavity a bonding pad for electrically connecting an element and the substrate, by use of electrolytic plating or electroless plating.

3. The method of claim 1, wherein the seed layer is aluminum or nickel.

4. The method of claim 1, wherein the forming a first circuit pattern further comprises forming the first circuit pattern by use of a modified semi-additive process (MSAP).

5. The method of claim 1, wherein the laminating a second dry film further comprises exposing and developing a dry film on an area excluding where the second dry film is laminated.

6. The method of claim 1, wherein, in the laminating a dielectric layer, the dielectric layer is a prepreg.

7. The method of claim 1, further comprising forming a via hole for electrically connecting the first circuit pattern and the second circuit pattern.

* * * * *